United States Patent
Su

(10) Patent No.: US 11,388,813 B2
(45) Date of Patent: Jul. 12, 2022

(54) ELECTRONIC DEVICE

(71) Applicant: Lenovo (Beijing) Co., Ltd., Beijing (CN)

(72) Inventor: Hui Su, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 17/006,853

(22) Filed: Aug. 30, 2020

(65) Prior Publication Data

US 2021/0068248 A1 Mar. 4, 2021

(30) Foreign Application Priority Data

Aug. 30, 2019 (CN) .......................... 201910816064.1

(51) Int. Cl.
*H05K 1/02* (2006.01)
*H05K 9/00* (2006.01)
*H02H 9/04* (2006.01)

(52) U.S. Cl.
CPC ............. *H05K 1/0259* (2013.01); *H05K 1/02* (2013.01); *H05K 9/0067* (2013.01); *H02H 9/04* (2013.01); *H05K 9/00* (2013.01)

(58) Field of Classification Search
CPC .......... H05K 1/02; H05K 9/00; H05K 1/0259; H05K 9/0067; H02B 1/00; G11B 5/33; G11B 5/127; G11B 21/16; G11B 5/48; H02H 9/04; H02H 9/00
USPC .......................................... 361/56, 212, 220
See application file for complete search history.

(56) References Cited

U.S. PATENT DOCUMENTS

| | | | |
|---|---|---|---|
| 6,057,873 A * | 5/2000 | Adams, III | H01Q 1/50 348/E7.052 |
| 2004/0027779 A1 * | 2/2004 | Byrne | H05F 3/04 361/220 |
| 2006/0279887 A1 * | 12/2006 | Lu | H05K 9/0067 361/56 |
| 2007/0128908 A1 * | 6/2007 | Smadi | H01R 13/6485 439/181 |
| 2011/0115495 A1 * | 5/2011 | Kunii | H05K 1/0254 324/543 |
| 2013/0271883 A1 * | 10/2013 | Chang | G01R 31/2851 361/56 |
| 2018/0102605 A1 * | 4/2018 | Patton | H02J 7/007 |
| 2018/0239732 A1 * | 8/2018 | Yang | G09G 5/006 |

FOREIGN PATENT DOCUMENTS

| | | |
|---|---|---|
| CN | 201352455 Y | 11/2009 |
| CN | 102013595 A | 4/2011 |
| CN | 202817395 U | 3/2013 |
| CN | 206294411 U | 6/2017 |
| CN | 207183745 U | 4/2018 |

\* cited by examiner

*Primary Examiner* — Danny Nguyen
(74) *Attorney, Agent, or Firm* — Anova Law Group, PLLC

(57) ABSTRACT

An ESD protection device includes a communication cable and an ESD cable. An end of the communication cable is connected to an electronic device. The ESD cable is connected to the communication cable and configured to discharge static electricity of the electronic device through the communication cable. A first end of the ESD cable is connected to the communication cable, and a second end of the ESD cable is connected to the electronic device.

9 Claims, 5 Drawing Sheets

ELECTRONIC DEVICE

CROSS-REFERENCE TO RELATED APPLICATION

This application claims priority to Chinese Patent Application No. 201910816064.1, filed on Aug. 30, 2019, the entire content of which is incorporated herein by reference.

TECHNICAL FIELD

The present disclosure generally relates to the electronic technology field and, more particularly, to an electronic device.

BACKGROUND

With the development of electronic technology, various electronic devices have been produced. Various electronic devices need to meet certain electro-static discharge (ESD) standards. An ESD cable is an antistatic grounding wire used to channel static electricity to a proper ground while handling sensitive computer equipment.

An ESD test result of a Tethered HMD product with a metal shell does not meet ESD related technical requirements.

Therefore, how to make an electronic device to meet the ESD standard needs to be addressed.

SUMMARY

Embodiments of the present disclosure provide an ESD protection device including a communication cable and a cable. An end of the communication cable is connected to an electronic device. The ESD cable is connected to the communication cable and configured to discharge static electricity of the electronic device through the communication cable. A first end of the ESD cable is connected to the communication cable, and a second end of the ESD cable is connected to the electronic device.

Embodiments of the present disclosure provide a head-mounted wearable display device including a communication cable and a cable. An end of the communication cable is connected to the head-mounted wearable display device. The ESD cable is connected to the communication cable and configured to discharge static electricity of the head-mounted wearable display device through the communication cable. A first end of the ESD cable is connected to the communication cable, and a second end of the ESD cable is connected to the head-mounted wearable display device.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION OF THE EMBODIMENTS

The technical solutions in embodiments of the present disclosure are described in detail in conjunction with accompanying drawings in embodiments of the present disclosure. Described embodiments are only some embodiments not all the embodiments of the present disclosure. Based on embodiments of the disclosure, all other embodiments obtained by those of ordinary skill in the art without any creative work are within the scope of the present disclosure.

Figure 1:
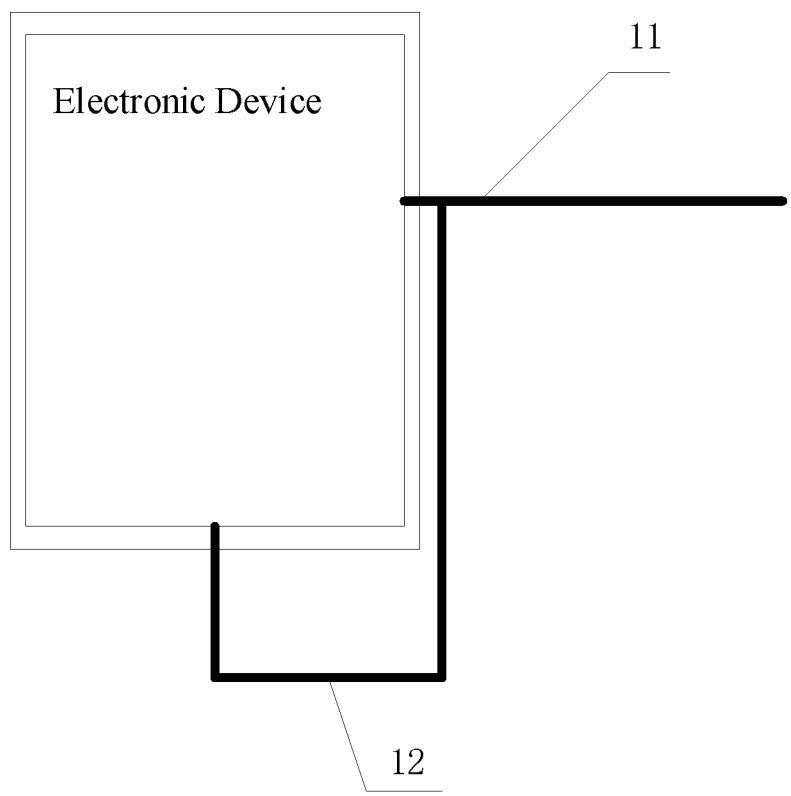
FIG. 1 illustrates a schematic structural diagram of an electronic device according to some embodiment of the present disclosure.

FIG. 1 illustrates a schematic diagram of an electronic device according to some embodiment of the present disclosure. The electronic device includes a communication cable 11, and an ESD cable 12 connected to the communication cable 11 for discharging electro-static of the electronic device through the communication cable 11. An end of the communication cable 11 is connected to the electronic device. A first end of the ESD cable 12 is connected to the communication cable 11, and a second end of the ESD cable 12 is connected to the electronic device.

When static electricity generated by the electronic device needs to be discharged so that the electronic device can meet a set ESD standard, the static electricity generated by the electronic device is transmitted through the ESD cable, one end of which is connected to the electronic device. As such, the static electricity is transmitted to the communication cable connected to the other end of the ESD cable. Then, the communication cable discharges the static electricity generated by the electronic device transmitted by the ESD cable. Compared to arranging a grounding elastic strip or a grounding foam inside the electronic device, with the technical solution of the present disclosure, the electronic device may meet the set ESD standard without occupying internal space of the electronic device. Further, the risk of a short circuit of electronic components of the electronic device caused by the grounding elastic strip or a grounding foam squeezing the electronic device may be avoided.

In some embodiments, the electronic device includes the communication cable, where an end of the communication cable is connected to the electronic device. The electronic device further includes the ESD cable connected to the communication cable. The ESD cable is configured to discharge the static electricity of the electronic device through the communication cable. The first end of the ESD cable is connected to the communication cable, and the second end of the ESD cable is connected to the electronic device. In the present disclosure, by providing the ESD cable at the electronic device, and connecting one end of the ESD cable to the electronic device and the other end of the ESD cable to the communication cable, the static electricity generated by the electronic device may be transmitted to the communication cable through the ESD cable, and discharged through the communication cable. As such, the electronic device may meet the set ESD standard, and the user experience may be improved.

Figure 2:
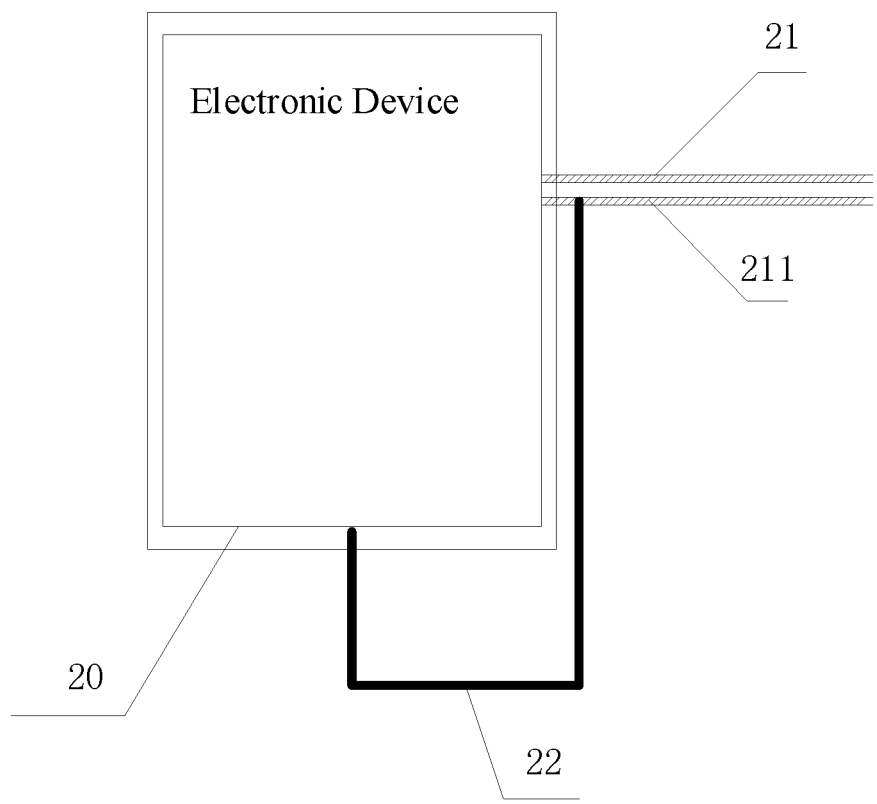
FIG. 2 illustrates a schematic structural diagram of an electronic device according to some embodiment of the present disclosure.

FIG. 2 illustrates a schematic structural diagram of an electronic device according to some embodiment of the present disclosure. The electronic device includes a metal housing 20, a communication cable 21, and an ESD cable 22 connected to the communication cable 21 and configured to discharge static electricity of the electronic device through the communication cable 21. The communication cable 21 includes a ground shield layer 211. An end of the communication cable 21 is connected to the electronic device. A first end of the ESD cable 22 is connected to the ground shield layer 211, and a second end of the ESD cable 22 is connected to the metal housing 20.

An operation principle of the electronic device according to the above-described includes as follows. When the static electricity generated by the electronic device needs to be discharged so that the electronic device can meet the set ESD standard, the static electricity generated by the electronic device may be transmitted through the ESD cable with the end connected to the metal housing of the electronic device. The static electricity may be then transmitted to the ground shield layer of the communication cable connected to the other end of the ESD cable. Then, the ground shield layer of the communication cable may discharge the static electricity generated by the electronic device transmitted by the ESD cable.

Compared to arranging the grounding elastic strip or a grounding foam inside the electronic device, with the technical solution of the present disclosure, the static electricity generated by the electronic device may be discharged through the ground shield layer of the communication cable. Since an unfolded area of the ground shield layer of the communication cable is large, most of the static electricity generated by the electronic device may be discharged, such that the electronic device may meet the set ESD standard. Further, the risk of the short-circuit of the electronic components of the electronic device caused by the grounded sheet and the grounded foam squeezing the electronic device may be avoided.

In some embodiments, the second end of the ESD cable may be provided as a ring-shaped end. The ring-shaped end of the ESD cable may be fixed on the inner wall of the metal housing of the electronic device by a screw. By providing the second end of the ESD cable as the ring-shaped end, the second end of the ESD cable may be fixed on the inner wall of the metal housing of the electronic device more conveniently by the screw.

Figure 3:
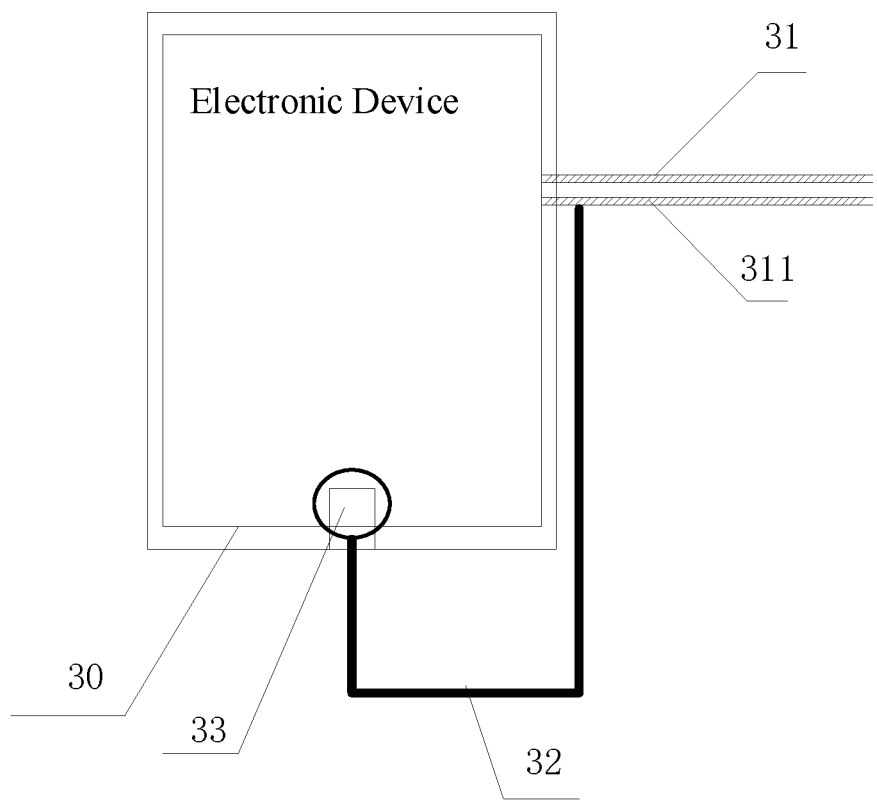
FIG. 3 illustrates a schematic structural diagram of an electronic device according to some embodiment of the present disclosure.

FIG. 3 illustrates a schematic structural diagram of an electronic device according to some embodiment of the present disclosure. The electronic device includes a metal housing 30, a communication cable 31, and a cable 32 connected to the communication cable 31 and configured to discharge the static electricity of the electronic device through the communication cable 31, and a camera mounting bracket 33. The communication cable 31 includes a ground shield layer 311. An end of the communication cable 31 is connected to the electronic device. A first end of the ESD cable 32 is connected to the ground shield layer 311, and a ring-shaped second end of the ESD cable 32 is mounted at the camera mounting bracket 33 and fixed on the inner wall of the metal housing 30 by a screw for fixing a camera.

In some embodiments, the operation principle of the electronic device includes as follows. When the static electricity generated by the electronic device needs to be discharged so that the electronic device can meet the set ESD standard, the ring-shaped end of the ESD cable may be mounted at the camera mounting bracket and fixed on the inner wall of the metal housing by the screw for fixing the camera. Thus, the static electricity generated by the electronic device may be transmitted to the ground shield layer of the communication cable connected to the other end of the ESD cable. Then, the ground shield layer of the communication cable may discharge the static electricity generated by the electronic device transmitted by the ESD cable.

Compared to arranging the grounding elastic strip or a grounding foam inside the electronic device, with the technical solution provided by the present disclosure, the static electricity generated by the electronic device may be discharged through the ground shield layer of the communication cable. Since an unfolded area of the ground shield layer of the communication cable is large, most of the static electricity generated by the electronic device may be discharged, such that the electronic equipment may meet the set ESD standard. The risk of the short circuit of the electronic components of the electronic device caused by the grounding spring sheet and the grounding foam squeezing the electronic device may be avoided.

In addition, when fixing the ring-shaped end of the ESD cable, the ring-shaped end of the ESD cable may be mounted at the camera mounting bracket of the electronic device, which is configured to mount the camera, and fixed on the inner wall of the metal housing of the electronic device by the screw for fixing the camera. As such, the ring-shaped end of the ESD cable may be fixed on the inner wall of the metal housing of the electronic device by using the provided camera mounting bracket and the screw for fixing the camera. Thus, the cost may be saved.

Figure 4:
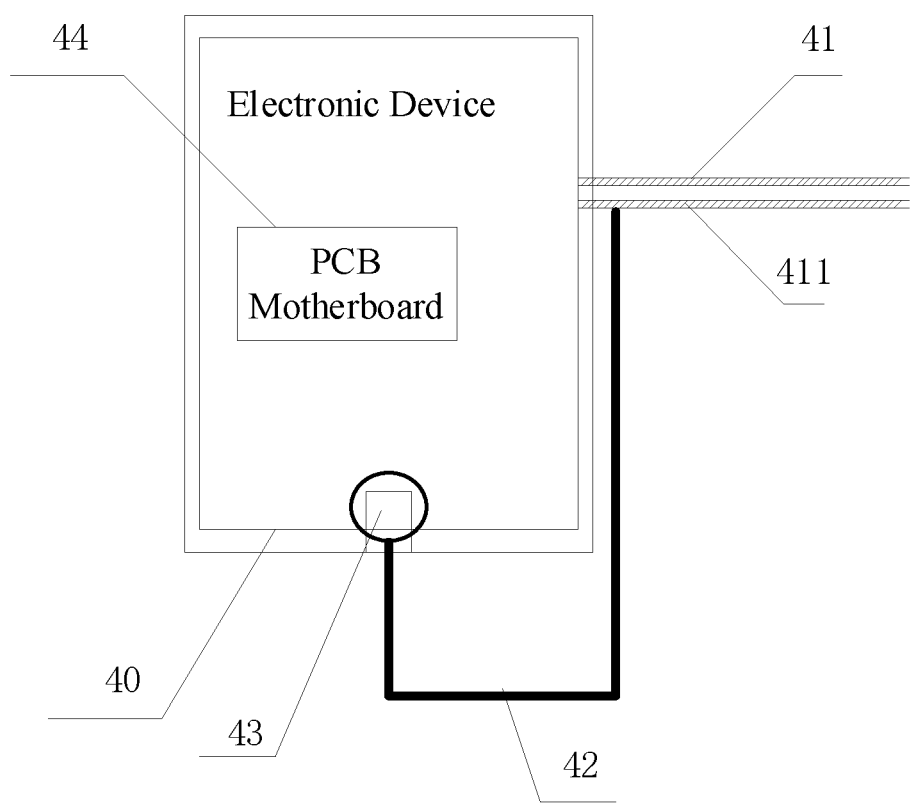
FIG. 4 illustrates a schematic structural diagram of an electronic device according to some embodiment of the present disclosure.

FIG. 4 illustrates a schematic structural diagram of an electronic device according to some embodiment of the present disclosure. The electronic device includes a metal housing 40, a communication cable 41, a cable 42 connected to the communication cable 41 and configured to discharge static electricity of the electronic device through the communication cable 41, a camera mounting bracket 43, and a printed circuit board (PCB) motherboard 44. The communication cable 41 includes a ground shield layer 411. An end of the communication cable 41 is connected to the electronic device. A first end of the ESD cable 42 is connected to the ground shield layer 411, and a ring-shaped second end of the ESD cable 42 is mounted at the camera mounting bracket 43 and fixed on the inner wall of the metal housing 30 by a screw for fixing a camera. The PCB motherboard 44 discharges the static electricity of the PCB motherboard 44 through a PCB motherboard ground 441.

In some embodiments, the operation principle of the electronic device disclosed includes as follows. When the static electricity generated by the electronic device needs to be discharged so that the electronic device can meet the set ESD standard, a ring-shaped end of the ESD cable may be mounted at the camera mounting bracket and fixed on the inner wall of the metal housing by a screw for fixing a camera. As such, the static electricity generated by the electronic device may be transmitted to the ground shield layer of the communication cable connected to the other end of the ESD cable. Then, the ground shield layer of the communication cable may discharge the static electricity generated by the electronic device transmitted by the ESD cable. Meanwhile, the PCB motherboard in the electronic device may discharge the static electricity of the PCB motherboard through the PCB motherboard ground.

Compared to arranging the grounding elastic strip or a grounding foam inside the electronic device, with the technical solution of the present disclosure, the static electricity generated by the electronic device may be discharged through the ground shield layer of the communication cable. Since an unfolded area of the ground shield layer of the communication cable is large, most of the static electricity generated by the electronic device may be discharged, so that the electronic equipment may meet the set ESD standard. The risk of the short circuit of the electronic components of the electronic device caused by the grounding elastic strip or a grounding foam squeezing the electronic device may be avoided.

In addition, when fixing the ring-shaped end of the ESD cable, the ring-shaped end of the ESD cable may be mounted at the camera mounting bracket of the electronic device, which is configured to mount the camera, and fixed on the inner wall of the metal housing of the electronic device by the screw for fixing the camera. As such, the ring-shaped end of the ESD cable may be fixed on the inner wall of the metal housing of the electronic device by the provided camera mounting bracket and the screw for fixing the camera. Thus, the mounting cost may be saved.

Figure 5:
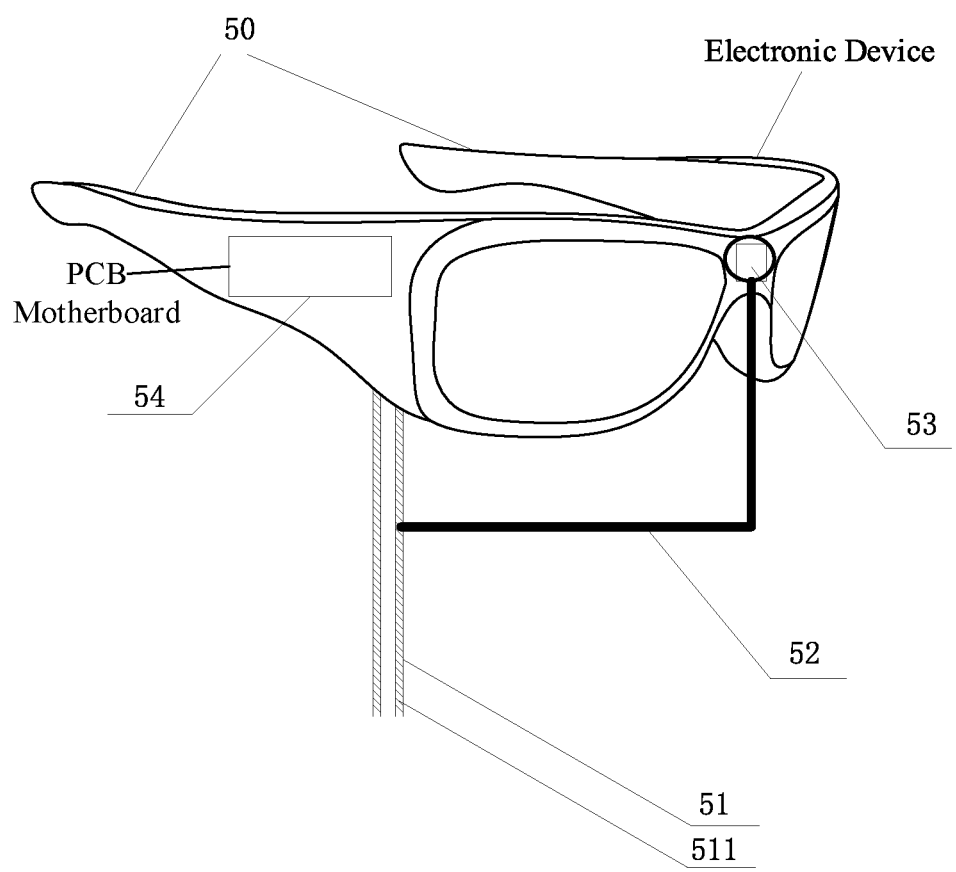
FIG. 5 illustrates a schematic structural diagram of an electronic device according to some embodiment of the present disclosure.

FIG. 5 illustrates a schematic structural diagram of an electronic device according to some embodiment of the present disclosure. The electronic device includes a head-mounted wearable display device. The head-mounted wearable display device includes a metal housing 50, a communication cable 51, a cable 52 connected to the communication cable and configured to discharge static electricity of the electronic device through the communication cable 51, a camera mounting bracket 53, and a PCB motherboard 54. The communication cable 51 includes a ground shielding layer 511. An end of the communication cable 51 is electronically connected to the electronic device. A first end of the ESD cable 52 is electronically connected to the ground shield layer 511, and a ring-shaped second end of the ESD cable 52 is mounted at the camera mounting bracket 53 and fixed on an inner wall of the metal housing 50 by a screw for fixing a camera. The PCB motherboard 54 discharges the static electricity of the PCB motherboard 54 through a PCB mainboard ground 541.

In some embodiments, the operation principle of the electronic device includes as follows. When the static electricity generated by the electronic device needs to be discharged so that the electronic device can meet the set ESD standard, the ring-shaped end of the ESD cable may be mounted at the camera mounting bracket and fixed on the inner wall of the metal housing by the screw for fixing the camera. As such, the static electricity generated by the electronic device may be transmitted to the ground shield layer of the communication cable connected to the other end of the ESD cable. Then, the ground shield layer of the communication cable may discharge the static electricity generated by the electronic device transmitted by the ESD cable. Meanwhile, the PCB motherboard of the electronic device may discharge the static electricity of the PCB motherboard through the PCB mainboard ground.

Compared to arranging the grounding elastic strip or a grounding foam inside the electronic device, with the technical solution of the present disclosure, the static electricity generated by the electronic device may be discharged through the ground shield layer of the communication cable. Since an unfolded area of the ground shield layer of the communication cable is large, most of the static electricity generated by the electronic device may be discharged, so that the electronic device may meet the set ESD standard. The risk of the short circuit of the electronic components of the electronic device caused by the grounding elastic strip or a grounding foam squeezing the electronic device may be avoided.

In addition, when fixing the ring-shaped end of the ESD cable, the ring-shaped end of the ESD cable may be mounted at the camera mounting bracket of the electronic device, which is configured to mount the camera, and fixed on the inner wall of the metal housing of the electronic device by the screw for fixing the camera. As such, the ring-shaped end of the ESD cable may be fixed on the inner wall of the metal housing by the provided camera mounting bracket and the screw for fixing the camera. Thus, the mounting cost may be saved.

In some embodiments, the communication cable of the electronic device may be a Type-C cable, or a display port (DP) cable, etc.

Various embodiments of the present disclosure are described progressively, and each embodiment focuses on the differences from other embodiments. The same or similar parts between various embodiments may be referred to as each other. For device or system embodiments, since they are similar to method embodiments, the description is relatively simple. For related parts, please refer to the part of the description of method embodiments.

In the present disclosure, relational terms such as first and second are only used to distinguish one entity or operation from another entity or operation and do not necessarily require or imply these entities or operations having such an actual relationship or order between them. Moreover, the terms "include," "contain," or any other variants thereof are intended to cover non-exclusive inclusion, so that a process, method, article, or device including a series of elements not only includes those elements, but also includes those that are not explicitly listed, or also include elements inherent to these process, method, article, or device. If there are no more restrictions, the element defined by the sentence "including a . . . " does not exclude the existence of other identical elements in the process, method, article, or device that includes the element.

The steps of the method or algorithm described in embodiments of the present disclosure may be directly implemented by hardware, a software module executed by a processor, or a combination thereof. The software module can be placed in random access memory (RAM), internal memory, read-only memory (ROM), electrically programmable ROM, electrically erasable programmable ROM, registers, hard disks, removable disks, CD-ROMs, or any other storage media well-known in the technical field.

The above-described description of embodiments of the present disclosure enables those skilled in the art to implement or use the present disclosure. Various modifications to these embodiments are obvious to those skilled in the art, and the general principles defined in the present disclosure may be implemented in other embodiments without departing from the spirit or scope of the present disclosure. Therefore, the present disclosure will not be limited to the embodiments in the specification, but should conform to the widest scope consistent with the principles and novel features of the present disclosure.

What is claimed is:

1. An electro-static discharge (ESD) protection device, comprising:
   a communication cable having a ground shield layer, an end of the communication cable being connected to an electronic device having a metal housing;
   an ESD cable electronically connected to the communication cable and configured to discharge static electricity of the electronic device through the communication cable, a first end of the ESD cable being connected to the ground shield layer of the communication cable, and a second end of the ESD cable being connected to the metal housing of the electronic device, wherein, the second end of the ESD cable includes a ring-shaped end being affixed on an inner wall of the metal housing by a fastener.

2. The ESD protection device of claim 1, the fastener is a screw.

3. The ESD protection device of claim 2, wherein the electronic device further comprises:

a camera mounting bracket, the ring-shaped end of the ESD cable is mounted at the camera mounting bracket and fixed on the inner wall of the metal housing by a screw for fixing a camera.

4. The ESD protection device of claim 1, further comprising:

a printed circuit board (PCB) motherboard discharging the static electricity of the PCB motherboard through a PCB motherboard ground.

5. The ESD protection device of claim 1, wherein the communication cable includes a Type-C cable.

6. The ESD protection device of claim 1, wherein the communication cable includes a display port (DP) cable.

7. A head-mounted wearable display device, comprising:

a communication cable having a ground shield layer, an end of the communication cable being connected to the head-mount wearable display device having a metal housing;

an ESD cable electronically connected to the communication cable and configured to discharge static electricity of the head-mount wearable display device through the communication cable, a first end of the ESD cable being connected to the ground shield layer of the communication cable, and a second end of the ESD cable being connected to the metal housing of the head-mount wearable display device, wherein, the second end of the ESD cable includes a ring-shaped end being affixed on an inner wall of the metal housing by a fastener.

8. The head-mounted wearable display device of claim 7, wherein the fastener is a screw.

9. The head-mounted wearable display device of claim 8, further comprising:

a camera mounting bracket, the ring-shaped end of the ESD cable is mounted at the camera mounting bracket and fixed on the inner wall of the metal housing by a screw for fixing a camera.

* * * * *